United States Patent
Fu et al.

(10) Patent No.: US 9,349,708 B2
(45) Date of Patent: May 24, 2016

(54) CHIP STACKED PACKAGE STRUCTURE AND ELECTRONIC DEVICE

(71) Applicant: Huawei Technologies Co., Ltd., Shenzhen (CN)

(72) Inventors: Huili Fu, Shenzhen (CN); Xiaodong Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/729,316

(22) Filed: Jun. 3, 2015

(65) Prior Publication Data

US 2015/0357307 A1 Dec. 10, 2015

(30) Foreign Application Priority Data

Jun. 5, 2014 (CN) .......................... 2014 1 0247207

(51) Int. Cl.
| | | |
|---|---|---|
| H01L 23/52 | (2006.01) | |
| H01L 25/065 | (2006.01) | |
| H01L 23/48 | (2006.01) | |
| H01L 23/528 | (2006.01) | |
| H01L 23/538 | (2006.01) | |
| H01L 23/498 | (2006.01) | |

(52) U.S. Cl.
CPC .......... *H01L 25/0652* (2013.01); *H01L 23/481* (2013.01); *H01L 23/528* (2013.01); *H01L 23/5384* (2013.01); *H01L 23/5389* (2013.01); *H01L 23/49816* (2013.01); *H01L 2224/16225* (2013.01); *H01L 2225/06548* (2013.01); *H01L 2225/06555* (2013.01); *H01L 2225/06572* (2013.01)

(58) Field of Classification Search
CPC . H01L 25/0652; H01L 23/481; H01L 23/528; H01L 23/5384
USPC .......................................................... 257/774
See application file for complete search history.

(56) References Cited

U.S. PATENT DOCUMENTS

| | | | |
|---|---|---|---|
| 7,619,901 B2* | 11/2009 | Eichelberger | ....... H01L 21/6835 361/763 |
| 7,659,145 B2 | 2/2010 | Do et al. | |
| 7,807,512 B2 | 10/2010 | Lee et al. | |
| 7,838,975 B2 | 11/2010 | Chen | |

(Continued)

OTHER PUBLICATIONS

Hunt et al., "Synergy between 2.5/3D Development and Hybrid 3D Wafer Level Fanout," 2012 4th Electronic System-Integration Technology Conference, pp. 1-10, Institute of Electrical and Electronics Engineers, New York, New York (Sep. 17-20, 2012).

*Primary Examiner* — Luan C Thai
(74) *Attorney, Agent, or Firm* — Leydig, Voit & Mayer, Ltd.

(57) ABSTRACT

A chip stacked package structure includes a first chip and a second chip, where the second chip is stacked with the first chip and the second chip includes a package layer and a first routing layer, where the package layer includes at least two dies and an attaching part configured to attach the at least two dies, where the attaching part is provided with multiple vias, with a part of vias in the multiple vias disposed at an outer periphery of the at least two dies, and the other part of vias in the multiple vias disposed between the at least two dies, and the first routing layer electrically connects the at least two dies; where the package layer is located between the first routing layer and the first chip, an electrically conductive material is provided in the multiple vias.

17 Claims, 3 Drawing Sheets

(56) References Cited

U.S. PATENT DOCUMENTS

| | | |
|---|---|---|
| 8,093,722 B2 | 1/2012 | Chen et al. |
| 8,310,051 B2 | 11/2012 | Chen et al. |
| 8,372,689 B2 | 2/2013 | Lee et al. |
| 8,389,333 B2 | 3/2013 | Camacho |
| 8,618,654 B2 * | 12/2013 | Sutardja ............... H01L 23/481 257/723 |
| 8,624,374 B2 | 1/2014 | Ding et al. |
| 8,624,376 B1 | 1/2014 | Chen et al. |
| 2012/0161332 A1 | 6/2012 | Chua et al. |
| 2012/0299191 A1 | 11/2012 | Camacho |
| 2013/0105991 A1 | 5/2013 | Gan et al. |
| 2013/0182402 A1 | 7/2013 | Chen et al. |
| 2013/0187270 A1 | 7/2013 | Yu et al. |
| 2013/0234322 A1 | 9/2013 | Pendse |
| 2013/0249101 A1 | 9/2013 | Lin et al. |
| 2013/0256836 A1 | 10/2013 | Hsiao et al. |
| 2013/0256883 A1 | 10/2013 | Meyer et al. |
| 2014/0001645 A1 | 1/2014 | Lin et al. |
| 2014/0015131 A1 | 1/2014 | Meyer et al. |

* cited by examiner

CHIP STACKED PACKAGE STRUCTURE AND ELECTRONIC DEVICE

CROSS-REFERENCE TO RELATED APPLICATION

This application claims priority to Chinese Patent Application No. 201410247207.9, filed on Jun. 5, 2014, which is hereby incorporated by reference in its entirety.

TECHNICAL FIELD

The present invention relates to the field of electronic technologies, and in particular, to a chip stacked package structure and an electronic device.

BACKGROUND

With development of the semiconductor industry, requirements for integration and miniaturization of semiconductor chips are increasingly high. To meet the integration and miniaturization requirements for semiconductor chips, package techniques are also continuously improved. Various types of stacked package techniques have also been successively developed and become increasingly important.

Common package techniques include wire bonding (Wire bonding) package, flip-chip bonding (Flip-chip bonding) package, and those derived therefrom including package on package (Package On Package), through silicon via (Through Silicon Via, TSV) package, fan out wafer level package (Fan Out Wafer Level Package, FOWLP), and the like.

In a conventional fan out wafer level package, interconnection of a top chip and a bottom chip is implemented in a stacking direction by providing a channel at a periphery of a package body of the bottom chip, fanning out input/output traces of a die on the bottom chip, in all directions, to a via at the periphery, and filling an electrically conductive material in the via.

In the prior art, there may be one, two, three, or more dies packaged in the bottom chip. The via is provided at the periphery of the package body of the bottom chip. The input/output traces of the die that are required to be connected to the top chip are fanned out in all directions to the via at the periphery of the package body, and go through the via and electrically connects to the top chip.

Therefore, when there are two or more dies in the bottom chip, input/output traces of one die that are required to be connected to the top chip (especially when the die has a large quantity of input/output traces) occupy most of routing space resources at a routing layer and affect traces interconnected dies in the bottom chip and other traces at the routing layer, which consequently causes difficulty of routing or increases a quantity of layers of the routing layer.

SUMMARY

Embodiments of the present invention provide a chip stacked package structure and an electronic device to solve the difficulty of tracing caused by providing a via at an outer periphery of a package body.

A first aspect of the present invention provides a chip stacked package structure, where the chip stacked package structure includes a first chip and a second chip, where the second chip is stacked with the first chip and the second chip includes a package layer and a first routing layer, where the package layer includes at least two dies and an attaching part configured to attach the at least two dies, where the attaching part is provided with multiple vias, a part of vias in the multiple vias are disposed at a periphery of the at least two dies, and the other part of vias in the multiple vias are disposed between the at least two dies, and the first routing layer electrically connects the at least two dies; where the package layer is located between the first routing layer and the first chip, an electrically conductive material is disposed in the multiple vias, and the electrically conductive material electrically connects the first routing layer and the first chip, so that the first chip is electrically connected to at least one die of the at least two dies.

In a first possible implementation manner of the first aspect, the attaching part is specifically a package part configured to package the at least two dies.

In a second possible implementation manner of the first aspect, the attaching part includes a package part and at least one via module, where the at least one via module is provided with the multiple vias, and the package part is configured to package the at least one via module and the at least two dies.

With reference to the second possible implementation manner of the first aspect, in a third possible implementation manner of the first aspect, the at least one via module is specifically a printed circuit board bar or a through silicon via module.

With reference to the first aspect or any one of the first to the third possible implementation manners of the first aspect, in a fourth possible implementation manner of the first aspect, the second chip further includes a second routing layer, where the second routing layer is disposed between the package layer and the first chip, and the second routing layer electrically connects the first chip and the electrically conductive material.

With reference to the first aspect or any one of the first to the fourth possible implementation manners of the first aspect, in a fifth possible implementation manner of the first aspect, the first chip is a memory chip, a silicon die, a flip-chip package, or a passive device.

With reference to the first aspect or any one of the first to the fifth possible implementation manners of the first aspect, in a sixth possible implementation manner of the first aspect, the first chip has a same structure as the second chip.

With reference to the first aspect or any one of the first to the sixth possible implementation manners of the first aspect, in a seventh possible implementation manner of the first aspect, the first chip is electrically connected to each die of the at least two dies by the electrically conductive material provided in at least two vias of the multiple vias.

A second aspect of the present invention provides an electronic device, where the electronic device includes a circuit board and a chip stacked package structure that is disposed on the circuit board, where the second chip is located between the first chip and the circuit board.

In a first possible implementation manner of the second aspect, the electronic device further includes a substrate that is disposed between the circuit board and the second chip and electrically connects the circuit board and the second chip.

The embodiments of the present invention have the following benefits:

In the present application, the vias are added between the at least two dies of the second chip. Thereby, input/output traces that are of the dies and fanned out in all directions can go through the vias at the periphery of the dies and electrically connects to a top chip. In this way, occupation of routing space resources at a routing layer is reduced, and resource utilization of routing space is improved. Further, lengths of traces between the dies and the first chip are reduced, signal load is decreased, and signal performance is improved. This solves the technical problem in the prior art that, when there are two or more dies in the bottom chip, input/output traces of one die that are required to be connected to a top chip (especially when the die has a large quantity of input/output traces) occupy most of routing space resources at a routing layer, and affect traces of interconnected dies in the bottom chip and other traces at the routing layer, which consequently causes difficulty of tracing or increases a quantity of layers of the routing layer.

BRIEF DESCRIPTION OF DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention.

DESCRIPTION OF EMBODIMENTS

To make a person skilled in the art understand the technical solutions in the present invention better, the following clearly and completely describes the technical solutions in the embodiments of the present invention with reference to the accompanying drawings in the embodiments of the present invention. Apparently, the described embodiments are merely a part rather than all of the embodiments of the present invention.

Embodiment 1

Figure 1:
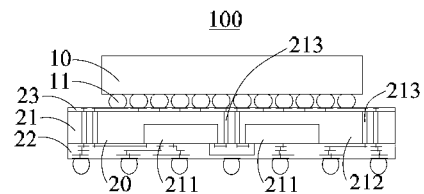
FIG. 1 is a schematic structural diagram of a chip stacked package structure according to an exemplary embodiment of the present application.

FIG. 1 is a schematic structural diagram of a chip stacked package structure 100 according to an exemplary embodiment of the present application. The chip stacked package structure 100 includes a first chip 10 and a second chip 20.

The first chip 10 may be a memory chip (Memory), a silicon die (Silicon Die), a flip chip package (Flip Chip Package), a passive device (Passive Device), and on the like, and may also be a fan out wafer level package that integrates a single die or multiple dies (Die). Solder balls 11 are disposed on the first chip 10, and the first chip 10 may be electrically connected to other electronic components by the solder balls 11. The solder balls 11 may be a solder ball (Solder ball), a solder bump (Solder Bump), or a Cu pillar (Cu Pillar).

Figure 2:
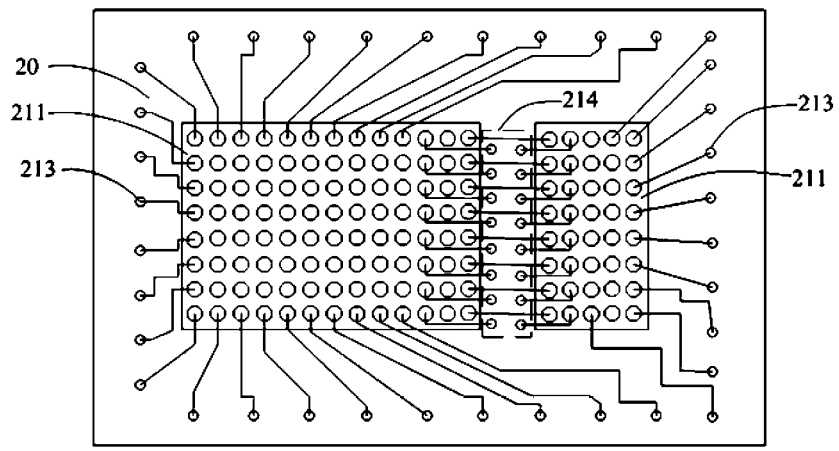
FIG. 2 is a bottom view of a second chip of the chip stacked package structure shown in FIG. 1.

With reference to FIG. 2, the second chip 20 and the first chip 10 are stacked and attached to each other. The second chip 20 has a same structure as the first chip 10, or may have a different structure from that of the first chip 10. A method of mass reflow (Mass Reflow) or thermo compression bonding (Thermo Compression Bonding) may be adopted to solder the second chip 20 and the first chip 10, and whether underfill (Underfill) is used in between to enhance strength and reliability of the structure may be determined according to a need. The second chip 20 includes a package layer 21 and a first routing layer 22.

The package layer 21 includes at least two dies 211 and an attaching part 212 configured to attach the at least two dies 211. In this embodiment, the accompanying drawing is described by using two dies 211 as an example. In other embodiments, a quantity of the dies 211 may not be limited to 2, and may be any number, for example three, four, five, or the like. A specific quantity may be set according to a need, and spacings between and positions of the dies may be set according to a need.

The attaching part 212 is provided with multiple vias 213. Of the multiple vias 213, a part of vias 213 are disposed at a periphery of the at least two dies 211, and the other part of vias 213 are disposed in an area 214 between the at least two dies 211. Different from the prior art where multiple vias 213 are disposed only at a periphery of the at least two dies 211, in the solution provided by the embodiment, at least one via 213 may also be disposed between two dies 211, so that it is unnecessary to dispose all vias 213 at the periphery of the at least two dies 211, which reduces difficulty of layout and routing.

The first routing layer 22 electrically connects the at least two dies 211. A quantity of layers of the first routing layer 22 may be set according to a need, and there may be one layer or may be multiple layers. A dielectric layer and a metal layer of the first routing layer 22 are manufactured by using wafer-level processes of coating, exposing, developing, curing, sputtering, electroplating and the like. Usually the metal layer is made of a material of conductive wires, such as copper wires. An exposable and developable organic dielectric layer is between the first routing layer 22 and the dies 211. Copper plated holes are produced at this dielectric layer to electrically connect the routing layer and solder pads on the dies 211. Because the first routing layer 22 covers an area on a die 211 and a periphery area of the die 211, the first routing layer 22 may connect the die 211 to the periphery area of the die 211 by means of routing.

The package layer 21 is located between the first routing layer 22 and the first chip 10. An electrically conductive material is disposed in each via of the multiple vias 213. For the electrically conductive material, an electroplating manner may be adopted to electroplate a conductive metal, such as copper, onto inner walls of the vias 213, and then the vias 213 are filled with another material, or the vias 213 are filled with the electrically conductive material directly. The electrically conductive material electrically connects the first routing layer 22 and the first chip 10, so that the first chip 10 is electrically connected to at least one die of the at least two dies 211 by the electrically conductive material disposed in at least two vias 213 of the multiple vias 213. That is, this enables electrical connection between the first chip 10 and all of the dies 211 of the second chip 20 or a part of the dies 211 of the second chip 20, which may be set according to a need.

In the chip stacked package structure 100, the vias 213 are added between the at least two dies 211 of the second chip 20. Thereby, input/output traces that are of the dies 211 and fanned out in all directions can go through the vias 213 at the periphery of the dies 211 so as to electrically connect to a top chip. In this way, occupation of routing space resources at a routing layer is reduced, and resource utilization of routing space is improved. Further, lengths of traces between the dies 211 and the first chip 10 are reduced, signal load is decreased, and signal performance is improved. This solves the technical problem in the prior art that, when there are two or more dies in the bottom chip, input/output traces of one die that are required to be connected to a top chip (especially when the die has a large quantity of input/output traces) occupy most of routing space resources at a routing layer, and affect traces of interconnected dies in the bottom chip and other traces at the routing layer, which consequently causes difficulty of tracing or increases a quantity of layers of the routing layer.

At least the following two manners are available for disposing a vias 213:

A first manner. The vias 213 are disposed directly in a package part of the dies 211.

That is, the attaching part 212 is specifically a package part configured to package the at least two dies 211. The package part may be made of a package material, such as a molding material. In this case, the vias 213 may be manufactured in the package part by means of laser drilling or deep reactive ion etching. Front faces of the at least two dies 211 are electrically connected to the first routing layer 22. Rear faces and side faces of the at least two dies 211 may be completely encapsulated in the package part, or the side faces may be encapsulated while the rear faces are exposed on the package part, which may be set according to on a need.

A second manner: A via module manner is adopted.

Figure 3:
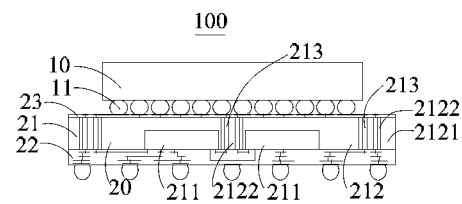
FIG. 3 is a schematic structural diagram of a chip stacked package structure according to another exemplary embodiment of the present application.

That is, as shown in FIG. 3, the attaching part 212 includes a package part 2121 and via modules 2122. The via module 2122 is a single component on which the multiple vias 213 are disposed. The multiple vias 213 may be located in one via module 2122, or may be located in multiple via modules 2122. In other words, a quantity of the via modules 2122 may be one or more, which is set according to an actual situation. The via modules 2122 are disposed on the periphery of the at least two dies 211 and between the at least two dies 211. The via module 2122 is specifically a printed circuit board bar (PCB Bar) or a through silicon via module.

The package part 2121 is configured to package the via modules 2122 and the at least two dies 211. The package part 2121 may be made of a package material, for example a molding material. Front faces of the at least two dies 211 are electrically connected to the first routing layer 22. Rear faces and side faces of the at least two dies 211 may be completely encapsulated in the package part 2121, or the side faces may be encapsulated while the rear faces are exposed on the package part, which may be set according to a need. Using the via module 2122 on which the vias 213 are disposed can decrease the difficulty in manufacturing holes by means of laser drilling or deep reactive ion etching, and improve the efficiency of hole manufacturing.

Further, when positions of the solder balls 11 of the first chip 10 correspond to positions of the multiple vias 213, the first chip 10 may be electrically connected to the dies 211 on the second chip 20 directly by the electrically conductive material in the multiple vias 213. When positions of the solder balls 11 of the first chip 10 do not correspond to positions of the multiple vias 213, a second routing layer 23 needs to be disposed on a surface of the second chip 20 opposite to the first chip 10. Specifically, the second routing layer 23 is disposed between the package layer 21 and the first chip 10, and the second routing layer 23 electrically connects the electrically conductive material in the vias 213 and the first chip 10. A quantity of layers of the second routing layer 23 may be set according to a need, and may be one layer or may be multiple layers. The second routing layer 23 is manufactured by using wafer-level processes of sputtering, electroplating, and the like, and is usually a material of conductive wires, such as copper wires.

By disposing the second routing layer 23 on the surface of the second chip 20 opposite to the first chip 10, the second routing layer 23 can electrically connect the electrically conductive material in the vias 213 and the first chip 10 when positions of the solder balls 11 of the first chip 10 do not correspond to positions of the multiple vias 213.

Figure 4:
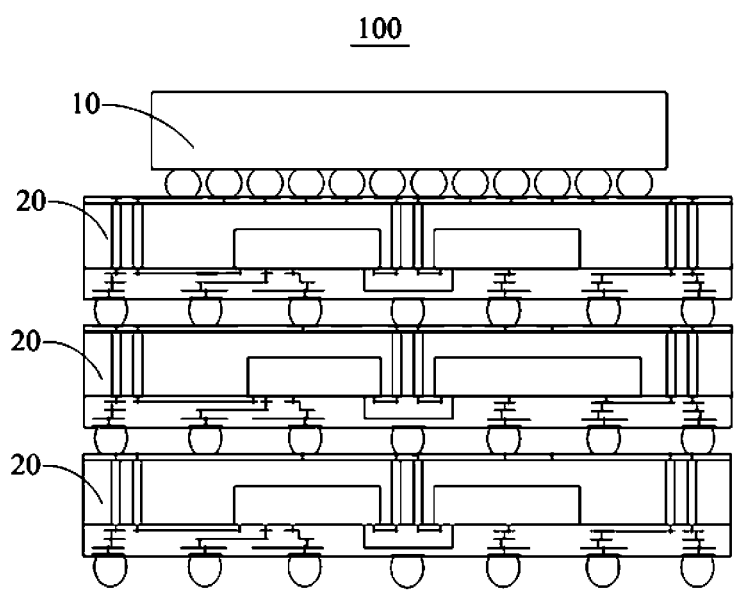
FIG. 4 is a schematic structural diagram of a chip stacked package structure according to yet another exemplary embodiment of the present application.

In addition, a quantity of chips in the chip stacked package structure 100 may include only the first chip 10 and the second chip 20, as shown in FIG. 1 and FIG. 3, but the quantity of chips in the chip stacked package structure 100 may not be limited to two. As shown in FIG. 4, a quantity of the second chips 20 is three. In other words, the quantity of chips in the chip stacked package structure 100 is four. In another implementation manner, the quantity of the second chips 20 may be two, four or more.

Embodiment 2

Figure 5:
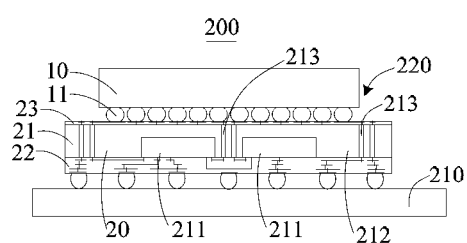
FIG. 5 is a schematic structural diagram of an electronic device according to an exemplary embodiment of the present application.

Based on a same inventive idea, the present application further provides an electronic device. FIG. 5 shows a schematic structural diagram of an electronic device 200 of the present application. The electronic device 200 includes a circuit board 210 and a chip stacked package structure 220 that is disposed on the circuit board 210. The chip stacked package structure 220 has a same structure and same functions as the chip stacked package structure 100 in Embodiment 1, and is not further described herein. The second chip 20 of the chip stacked package structure 220 is located between the first chip 10 and the circuit board 210.

The electronic device 200 adopts the chip stacked package structure 220, where the vias 213 are added between the at least two dies 211 of the second chip 20. Thereby, input/output traces that are of the dies 211 and fanned out in all directions can go through the vias 213 at the periphery of the dies 211 and electrically connect to a top chip. In this way, occupation of routing space resources at a routing layer is reduced, and resource utilization of routing space is improved. Further, lengths of traces between the dies 211 and the first chip 10 are reduced, signal load is decreased, and signal performance is improved. This solves the technical problem in the prior art that, when there are two or more dies in the bottom chip, input/output traces of one die that are required to be connected to a top chip (especially when the die has a large quantity of input/output traces) occupy most of routing space resources at a routing layer, and affect traces of interconnected dies in the bottom chip and other traces at the routing layer, which consequently causes difficulty of tracing or increases a quantity of layers of the routing layer.

Figure 6:
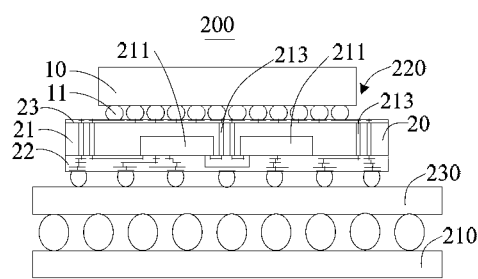
FIG. 6 is a schematic structural diagram of an electronic device according to another exemplary embodiment of the present application.

The second chip 20 may be electrically connected to the circuit board 210 directly by using a solder ball, or, as shown in FIG. 6, a substrate 230 may be disposed between the circuit board 210 and the second chip 20, and the second chip 20 is electrically connected to the substrate 230 by using a solder bump, and then is electrically connected to the circuit board 210 by using a solder ball. Between the substrate 230 and the second chip 20, whether underfill (Underfill) is used to enhance strength and reliability of the structure is determined according to a need. The substrate 230 is disposed between the second chip 20 and the circuit board 210. By using the substrate 230, routing resources and a quantity of package pins can be increased, so as to improve power integrity of the second chip 20 and improve board-level reliability of the package.

Although some exemplary embodiments of the present invention have been described, persons skilled in the art can make changes and modifications to these embodiments once they have learnt the basic inventive concept. Therefore, the following claims are intended to be construed as to cover the exemplary embodiments and all changes and modifications falling within the scope of the present invention. Further, unless particularly stated, reference to the word "connect" in the embodiments of the invention should be understood as an electrical connection.

Obviously, a person skilled in the art can make various modifications and variations to the present invention without departing from the spirit and scope of the present invention. The present invention is intended to cover these modifications and variations provided that they fall within the scope of protection defined by the following claims and their equivalents.

What is claimed is:

1. A chip stacked package structure, wherein the chip stacked package structure comprises:
    a first chip; and
    a second chip, stacked with the first chip, wherein the second chip comprises:
    a package layer, wherein the package layer comprises at least two dies and an attaching part configured to attach the at least two dies, wherein the attaching part is provided with multiple vias, a first part of vias in the multiple vias are disposed at a periphery of the at least two dies, and a second part of vias in the multiple vias are disposed between the at least two dies; and
    a first routing layer, electrically connecting the at least two dies; wherein
    the package layer is located between the first routing layer and the first chip, an electrically conductive material is disposed in the multiple vias, and the electrically conductive material electrically connects the first routing layer and the first chip, so that the first chip is electrically connected to at least one die of the at least two dies, and
    the first part of vias surrounds the at least two dies and an area located between the at least two dies, and the second part of vias is located within the area.

2. The chip stacked package structure according to claim 1, wherein the attaching part is specifically a package part configured to package the at least two dies.

3. The chip stacked package structure according to claim 1, wherein the attaching part comprises a package part and at least one via module, wherein the at least one via module is provided with the multiple vias, and the package part is configured to package the at least one via module and the at least two dies.

4. The chip stacked package structure according to claim 3, wherein the at least one via module is specifically a printed circuit board bar or a through silicon via module.

5. The chip stacked package structure according to claim 1, wherein the second chip further comprises a second routing layer, wherein the second routing layer is disposed between the package layer and the first chip, and the second routing layer electrically connects the first chip and the electrically conductive material.

6. The chip stacked package structure according to claim 1, wherein the first chip is a memory chip, a silicon die, a flip chip package, or a passive device.

7. The chip stacked package structure according to claim 1, wherein the first chip has a same structure as the second chip.

8. The chip stacked package structure according to claim 1, wherein the first chip is electrically connected to each die of the at least two dies by the electrically conductive material provided in at least two vias of the multiple vias.

9. An electronic device, wherein the electronic device comprises:
    a circuit board; and
    a chip stacked package that is disposed on the circuit board, wherein the chip stacked package structure comprises:
    a first chip; and
    a second chip, stacked with the first chip, wherein the second chip comprises:
    a package layer, wherein the package layer comprises at least two dies and an attaching part configured to attach the at least two dies, wherein the attaching part is provided with multiple vias, a first part of vias in the multiple vias are disposed at a periphery of the at least two dies, and a second part of vias in the multiple vias are disposed between the at least two dies; and
    a first routing layer, electrically connecting the at least two dies; wherein
    the package layer is located between the first routing layer and the first chip, an electrically conductive material is disposed in the multiple vias, and the electrically conductive material electrically connects the first routing layer and the first chip, so that the first chip is electrically connected to at least one die of the at least two dies;
    wherein the second chip is located between the first chip and the circuit board, and
    the first part of vias surrounds the at least two dies and an area located between the at least two dies, and the second part of vias is located within the area.

10. The electronic device according to claim 9, wherein the electronic device further comprises a substrate that is disposed between the circuit board and the second chip and electrically connects the circuit board and the second chip.

11. The electronic device according to claim 9, wherein the attaching part is specifically a package part configured to package the at least two dies.

12. The electronic device according to claim 9, wherein the attaching part comprises a package part and at least one via module, wherein the at least one via module is provided with the multiple vias, and the package part is configured to package the at least one via module and the at least two dies.

13. The electronic device according to claim 12, wherein the at least one via module is specifically a printed circuit board bar or a through silicon via module.

14. The electronic device according to claim 9, wherein the second chip further comprises a second routing layer, wherein the second routing layer is disposed between the package layer and the first chip, and the second routing layer electrically connects the first chip and the electrically conductive material.

15. The electronic device according to claim 9, wherein the first chip is a memory chip, a silicon die, a flip chip package, or a passive device.

16. The electronic device according to claim 9, wherein the first chip has a same structure as the second chip.

17. The electronic device according to claim 9, wherein the first chip is electrically connected to each die of the at least two dies by the electrically conductive material provided in at least two vias of the multiple vias.

* * * * *